(12) United States Patent
Lloyd et al.

(10) Patent No.: US 12,216,151 B2
(45) Date of Patent: Feb. 4, 2025

(54) MEASUREMENT INSTRUMENT, MEASUREMENT SYSTEM, AND TESTING METHOD OF TESTING A DEVICE UNDER TEST

(71) Applicant: Rohde & Schwarz GmbH & Co. KG, Munich (DE)

(72) Inventors: Paul Gareth Lloyd, Munich (DE); Markus Loerner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 112 days.

(21) Appl. No.: 18/306,829

(22) Filed: Apr. 25, 2023

(65) Prior Publication Data

US 2024/0361377 A1 Oct. 31, 2024

(51) Int. Cl.
*G01R 31/28* (2006.01)

(52) U.S. Cl.
CPC ..... *G01R 31/2841* (2013.01); *G01R 31/2837* (2013.01)

(58) Field of Classification Search
CPC .................................................. G01R 31/002
See application file for complete search history.

(56) References Cited

U.S. PATENT DOCUMENTS

| 9,973,219 | B2 | 5/2018 | Lagler et al. | |
| 11,137,439 | B1* | 10/2021 | Tsironis | G01R 35/005 |
| 12,052,008 | B1* | 7/2024 | Tsironis | G01R 31/2822 |

OTHER PUBLICATIONS

Marchetti, M. et al., "Active Harmonic Load-Pull With Realistic Wideband Communications Signals," Maury Microwave Corporation, IEEE Transactions on Microwave Theory and Techniques, vol. 56, No. 12; Dec. 2008; republished. Jun. 17, 2020; pp. 1-13.

* cited by examiner

*Primary Examiner* — Tung X Nguyen
(74) *Attorney, Agent, or Firm* — CHRISTENSEN O'CONNOR JOHNSON KINDNESS PLLC

(57) ABSTRACT

A measurement instrument for testing a DUT comprises a common port configured to be connectable to a signal output of the DUT for receiving a forward-travelling signal from the DUT. The measurement instrument further comprises a signal line connected to the common port, a signal analysis circuit and a signal generator circuit. The signal analysis circuit receives the forward-travelling signal from the common port. The signal analysis circuit is configured to analyze the forward-travelling signal in order to assess a performance of the DUT. The signal generator circuit is connected to the signal line and is configured to generate a backward-travelling signal that is forwarded to the common port. The signal generator circuit comprises a reference signal input configured to receive a reference signal from a reference signal generator. The signal generator circuit is configured to generate the backward-travelling signal based on the reference signal.

21 Claims, 5 Drawing Sheets

MEASUREMENT INSTRUMENT, MEASUREMENT SYSTEM, AND TESTING METHOD OF TESTING A DEVICE UNDER TEST

FIELD OF THE DISCLOSURE

Embodiments of the present disclosure generally relate to a measurement instrument for testing a device under test. Embodiments of the present disclosure further relate to a measurement system and to a testing method of testing a device under test by a measurement instrument.

BACKGROUND

With increasing demands on the performance of electronic devices and of electronic components, post final assembly testing of the performance of these devices and components is becoming ever more important, with ever increasing constraints on the test time allowed per device.

For example, in production testing of mobile device radio frequency front ends (RFFE), test time budgets are typically of the order of seconds per device under test (DUT).

Mechanically robust test fixtures, such as those used in mobile device production, present "dispersive" RF impedances to the devices under test, which are increasingly unsuitable for higher bandwidth and higher frequency DUTs, e.g. for electronic devices being configured to communicate via 5G New Radio.

Real world DUTs, i.e. DUTs with physical limitations, have to be measured with a specific load impedance presented to the DUT in order to obtain accurate measurement results. The performance of the DUTs at another impedance cannot be predicted or extrapolated.

The result is that the DUTs have to be designed with sufficient margins to overcome the measurement accuracy deficiencies. This results in larger, more costly, more inefficient, redundant designs.

Thus, there is a need for a measurement instrument and a measurement system that allow for a more efficient assessment of the performance of a device under test.

SUMMARY

Embodiments of the present disclosure provide a measurement instrument for testing a device under test. In an embodiment, the measurement instrument comprises a common port configured to be connectable to a signal output of the device under test, wherein the common port is configured to receive a forward-travelling signal from the device under test. The measurement instrument further comprises a signal line connected to the common port. The measurement instrument further comprises a signal processing circuit, wherein the signal processing circuit comprises a signal analysis circuit and a signal generator circuit. The signal analysis circuit is connected with the common port so as to receive the forward-travelling signal from the common port. The signal analysis circuit is configured to analyze the forward-travelling signal in order to assess a performance of the device under test. The signal generator circuit is connected to the signal line, wherein the signal generator circuit is configured to generate a backward-travelling signal that is forwarded to the common port. The signal generator circuit comprises a reference signal input, the reference signal input being configured to receive a reference signal from a reference signal generator. The signal generator circuit is configured to generate the backward-travelling signal based on the reference signal.

The measurement instrument according to embodiments of the disclosure is based on the idea to couple the reference signal generator circuit and the signal generator circuit via the reference signal input, such that the backward-travelling signal is synchronized with the forward-travelling signal. This way, a better defined impedance is presented to the device under test, which allows for assessing the performance of the device under test with high precision.

In other words, the device under test outputs the forward-travelling signal, and the signal generator circuit outputs the backward-travelling signal, for example wherein the backward-travelling signal is synchronized with the forward-travelling signal and/or coherent to the forward-travelling signal.

According to the present disclosure, the backward-travelling signal does not have to be determined based on the forward-travelling signal before generating the backward-travelling signal. Corresponding approaches of determining the backward-travelling signal based on the forward-travelling signal are known in the state of the art as "load pull" techniques.

Instead, the backward-travelling signal may be determined in a previous measurement by performing measurements on a known-good device under test or based on a mathematical model of the device under test, as will be described in more detail below.

In some embodiments, it has turned out that, compared to techniques known in state of the art using test fixtures having a predefined impedance, the measurement instrument according to embodiments of the present disclosure allows to assess the performance of the device under test with significantly enhanced accuracy.

Compared to load pull techniques known in state of the art, the measurement instrument according to embodiments of the present disclosure allows to assess the performance of the device under test with significantly reduced test times and in a more cost efficient manner.

In some embodiments, the analysis circuit may be configured to determine at least one performance parameter in order to assess the performance of the device under test. For example, the at least one performance parameter may comprise an error vector magnitude (EVM) and/or an adjacent channel leakage ratio (ACLR).

In some embodiments, the forward-travelling signal may be an IQ data signal comprising IQ data. Accordingly, the analysis circuit may determine IQ data associated with forward-travelling signal in order to assess the performance of the DUT.

In some embodiments, the backward-travelling signal may be an IQ data signal.

According to an aspect of the present disclosure, the signal generator circuit is, for example, configured to generate the backward-travelling signal based on the reference signal such that the backward-travelling signal is forwarded to the common port in time with receiving an output signal of the device under test via the common port. In other words, the generation of the backward-travelling signal is synchronized with the generation of the forward-travelling signal such that the forward-travelling signal and the backward-travelling signal arrive at the common port at the same time. Thus, from the viewpoint of the device under test receiving the backward-travelling signal, the backward-travelling signal appears like a reflected version of the forward-travelling signal. This results in a certain impedance being presented to the device under test, such that the correct measurement conditions for testing the device under test are obtained.

In an embodiment of the present disclosure, the signal line comprises a first directional coupler portion, wherein the signal analysis circuit is connected with the common port via the first directional coupler portion. Accordingly, the first directional coupler portion is configured to forward the forward-travelling signal to the signal analysis circuit.

For example, the first directional coupler portion may be established as a 3-port directional coupler.

The measurement instrument may further comprise a signal shaping circuit, wherein the signal shaping circuit is interconnected between the signal generator circuit and the common port. In general, the signal shaping circuit is configured to alter the backward-travelling signal in a predefined manner.

According to an aspect of the present disclosure, the signal shaping circuit comprises, for example, at least one of an amplifier circuit, an attenuator circuit, or a filter circuit. Thus, the signal shaping circuit may be configured to amplify, attenuate, and/or filter the backward-travelling signal in a predefined manner.

In a further embodiment of the present disclosure, the signal generator circuit is configured to generate the backward-travelling signal such that the forward-travelling signal and the backward-travelling signal have a predefined amplitude relation and/or a predefined phase relation.

For example, the backward-travelling signal may correspond to the forward-travelling signal, reflected at a predetermined impedance presented to the device under test. Thus, the correct measurement conditions for testing the device under test are obtained.

According to another aspect of the present disclosure, the signal generator circuit is configured, for example, to generate the backward-travelling signal such that the forward-travelling signal and the backward-travelling signal have the same modulation type. Accordingly, the measurement instrument according to the presented disclosure can be used for testing devices under test employing arbitrary modulation schemes.

In an embodiment of the present disclosure, the reference signal corresponds to an input signal of the device under test or to a signal generated by the device under test.

If the reference signal corresponds to the input signal of the device under test, the device under test processes the reference signal, thereby generating the forward-travelling signal. Accordingly, the reference signal generator may be established separately from the device under test.

If the reference signal corresponds to a signal generated by the device under test, the device under test may generate and internally process the reference signal, thereby generating the forward-travelling signal. Accordingly, the reference signal generator may be integrated into the device under test.

According to an aspect of the present disclosure, the signal line comprises, for example, a second directional coupler portion, wherein the signal analysis circuit is connected with the signal generator circuit via the second directional coupler portion so as to receive the backward-travelling signal. Accordingly, the second directional coupler portion is configured to forward the backward-travelling signal to the signal analysis circuit.

For example, the second directional coupler portion may be established as a 3-port directional coupler.

The first directional coupler portion and the second directional coupler portion may be established separately from each other. Alternatively, the first directional coupler portion and the second directional coupler portion may be integrated into a single directional coupler, for example into a 4-port directional coupler.

In some embodiments, the signal analysis circuit may be configured to determine an impedance presented to the device under test based on the forward-travelling signal and based on the backward-travelling signal. For example, the signal analysis circuit may be configured to compare the impedance presented to the device under test with a desired impedance that is to be presented to the device under test in order to assess whether the correct measurement conditions for testing the device under test are set.

According to an aspect of the present disclosure, the signal analysis circuit is configured, for example, to assess the performance of the device under test based on the forward-travelling signal and based on the backward-travelling signal. For example, the signal analysis circuit may be configured to determine the impedance presented to the device under test, and to consider the impedance presented to the device under test for assessing the performance of the device under test.

In some embodiments, the signal analysis circuit may be configured to determine whether the determined impedance meets certain criteria. For example, the signal analysis circuit may be configured to determine whether the determined impedance lies within a predetermined impedance range. If the determined impedance lies within the predetermined range, it may be concluded that the device under test has passed the test. If the determined impedance lies outside of the predetermined range, it may be concluded that the device under test has failed the test.

In an embodiment of the present disclosure, the measurement instrument is configured to operate the signal generator circuit independent of the signal analysis circuit. In other words, no feedback loop may be provided between the signal analysis circuit and the signal generator circuit. Accordingly, the backward-travelling signal is not adapted based on measurement results obtained by the signal analysis circuit. This way, the time necessary for assessing the performance of the device under test can be reduced significantly.

According to another aspect of the present disclosure, the backward-travelling signal corresponds, for example, to at least one of a desired load impedance, a DUT distortion, a DUT modulation, a DUT input power, or a DUT output power. In some embodiments, the backward-travelling signal may correspond to a sequence of load impedances, DUT distortions, DUT modulations, DUT input powers, and/or DUT output powers. For example, the sequence of load impedances, DUT distortions, DUT modulations, DUT input powers, and/or DUT output powers may be defined by a test protocol for the device under test.

In a further embodiment of the present disclosure, the backward-travelling signal is generated based on pre-recorded measurement results obtained with a known-good device under test. The known-good device under test may also be called a "golden sample".

For example, measurements may be conducted on the known-good device under test by a load pull technique, wherein the backward-travelling signal presented to the known-good device under test is iteratively adapted until the correct impedance is presented to the known-good device under test. Signal generator data associated with the backward-travelling signal corresponding to the correct impedance may be saved in a memory of the measurement instrument. Thus, the backward-travelling signal may be played back by means of signal generator circuit based on the signal generator data saved in the memory in order to perform tests on other devices under test, for example on other devices under test being constructed identically to the known-good device under test.

The backward-travelling signal may be generated based on a mathematical model of the device under test. Thus, the backward-travelling signal may be determined based on the mathematical model of the device under test, for example based on the mathematical model of the device under test and based on a desired impedance to be presented to the device under test.

In other words, the backward-travelling signal may be theoretically calculated based on the mathematical model of the device under test.

Signal generator data associated with the determined backward-travelling signal corresponding to the correct impedance may be saved in a memory of the measurement instrument. Thus, the backward-travelling signal may be played back by means of signal generator circuit based on the signal generator data saved in the memory in order to perform tests on devices under test.

A further aspect of the present disclosure provides that the measurement instrument is established, for example, as a signal analyzer, a vector signal analyzer, an oscilloscope, a digital oscilloscope, or a vector network analyzer. However, it is to be understood that the measurement instrument may be established as any other suitable type of measurement instrument.

According to another aspect of the present disclosure, the signal analysis circuit is configured, for example, to determine at least one of a error vector magnitude (EVM) or an adjacent channel leakage ratio (ACLR) based on the forward-travelling signal. Thus, the performance of the device under test may be assessed based on the determined EVM and/or based on the determined ACLR. However, it is to be understood that the signal analysis circuit may be configured to determine any other suitable performance parameter in order to assess the performance of the device under test.

In some embodiments, the signal analysis circuit may be configured to compare the at least one determined performance parameter, e.g. the EVM and/or the ACLR, with at corresponding measurement result of a known-good device under test.

If the at least one determined performance parameter differs from the corresponding measurement result of the known-good device by less than a predefined amount, it may be concluded that the device under test has passed the test.

If the at least one determined performance parameter differs from the corresponding measurement result of the known-good device by more than the predefined amount, it may be concluded that the device under test has failed the test.

It is also conceivable that the signal analysis circuit is configured to determine the at least one of the error vector magnitude (EVM) or the adjacent channel leakage ratio (ACLR) based on the forward-travelling signal and based on the backward-travelling signal.

Embodiments of the present disclosure further provide a measurement system. In an embodiment, the measurement system comprises a measurement instrument described above and a device under test.

Regarding the further advantages and properties of the measurement system, reference is made to the explanations given above with respect to the measurement instrument, which also hold for the measurement system and vice versa.

According to an aspect of the present disclosure, the reference signal generator is established, for example, separately from the device under test and from the measurement instrument.

For example, the reference signal generator may be established as a standalone signal generator. Alternatively, the reference signal generator may be integrated into the measurement instrument.

According to another aspect of the present disclosure, the reference signal generator is, for example, integrated into the device under test. Thus, the forward-travelling signal corresponds to the reference signal generated and processed by the device under test.

The device under test may comprise an additional port for forwarding the reference signal to the reference signal input of the signal generator circuit.

Alternatively, the measurement system may comprise a directional coupler, wherein the directional coupler is connected with the device under test, the common port, and the reference signal input. The directional coupler may be configured to forward the forward-travelling signal to the common port and to the reference signal input.

Embodiments of the present disclosure further provide a testing method of testing a device under test by a measurement instrument. The measurement instrument comprises a common port and a signal processing circuit. The common port is connectable to a signal output of the device under test. The signal processing circuit comprises a signal analysis circuit and a signal generator circuit. The signal generator circuit comprises a reference signal input. In an embodiment, the testing method comprises the steps of:

receiving, by the common port, a forward-travelling signal from the device under test;

receiving, by the reference signal input, a reference signal from a reference signal generator;

generating, by the signal generator circuit, a backward-travelling signal based on the reference signal;

forwarding the backward-travelling signal to the common port; and analyzing, by the signal analysis circuit, the forward-travelling signal in order to assess a performance of the device under test.

In some embodiments, the measurement instrument described above may be configured to perform the testing method. Likewise, the measurement system described above may be configured to perform the testing method.

Regarding the further advantages and properties of the testing method, reference is made to the explanations given above with respect to the measurement instrument and with respect to the measurement system, which also hold for the testing method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
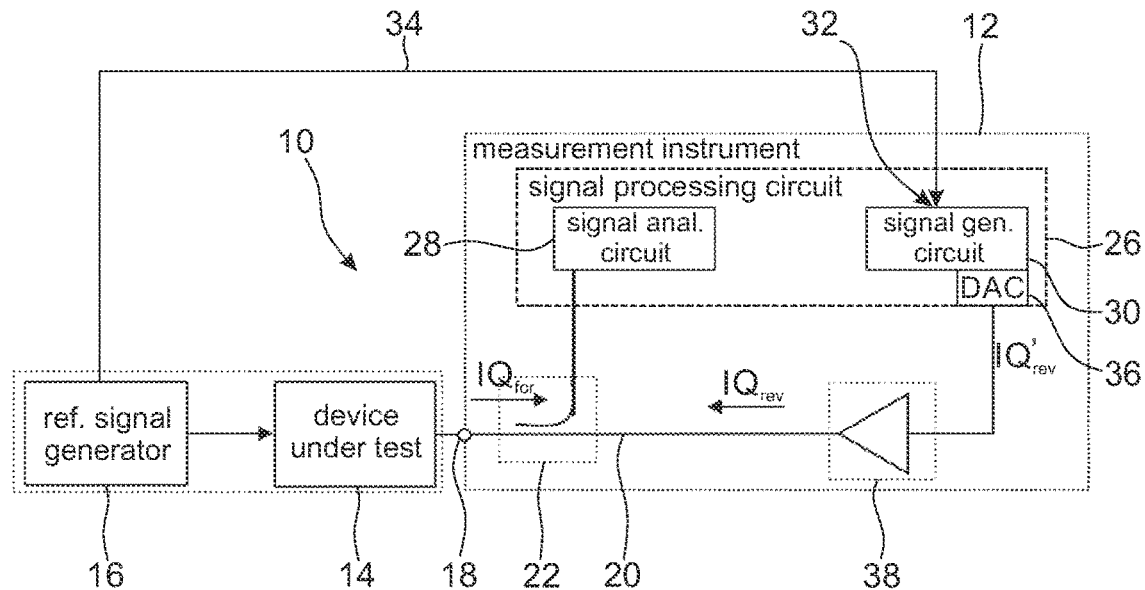
FIG. 1 schematically shows a measurement system according to a first embodiment of the present disclosure.

FIG. 1 shows a representative measurement system 10 in accordance with an embodiment of the disclosure. As shown, the system comprising a measurement instrument 12 and a device under test 14. In general, the measurement instrument 12 is configured to analyze an output signal generated by the device under test 14 in order to assess the performance of the device under test 14.

The device under test 14 may be established as any electronic device that is configured to generate an output signal being an IQ data signal, for example a single carrier orthogonal frequency division multiplexing (OFDM) signal. For example, the device under test 14 may be established as an electronic device with an integrated signal generator generating the IQ data signal, such as, for example, a mobile phone. Alternatively, the device under test 14 may be configured as an electronic device being configured to process an IQ data signal such as, for example, an RF front end, an RF antenna, an amplifier, a mixer, a filter, etc.

In the embodiment of FIG. 1, the measurement system 10 may comprise a reference signal generator 16 that is configured to generate an input signal that is provided to a signal input of the device under test 14. The device under test 14 processes the input signal, thereby generating the output signal. In the embodiment shown in FIG. 1, the reference signal generator 16 is provided separately from the measurement instrument 12. However, the reference signal generator 16 may also be integrated into the measurement instrument 12 or into the device under test 14.

The measurement instrument 12 may be established as any type of suitable measurement device, e.g. as a vector network analyzer, as a digital oscilloscope, or as a signal analyzer. The measurement instrument 12 comprises a common port 18 that is connected with a signal output of the device under test 14, such that the common port 18 receives the output signal generated by the device under test 14. The measurement instrument 12 further comprises a signal line 20 that is connected with the common port 18.

Figure 2:
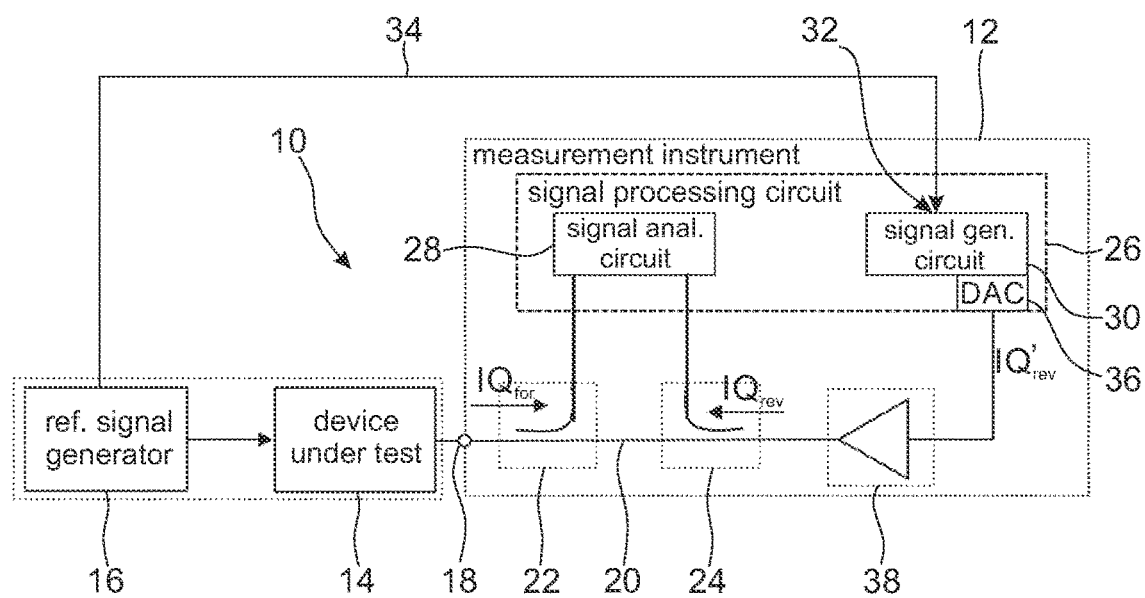
FIG. 2 schematically shows a measurement system according to a second embodiment of the present disclosure.

The signal line 20 comprises a first directional coupler portion 22. Optionally, the signal line 20 may further comprise a second directional coupler portion 24, as is illustrated in FIG. 2. In the embodiment shown in FIG. 2, the first directional coupler portion 22 and the second directional coupler portion 24 are established as separate three-port directional couplers. Alternatively, the first directional coupler portion 22 and the second directional coupler portion 24 may be integrated into a single directional coupler, e.g. into a four-port directional coupler.

The measurement instrument 12 further comprises a signal processing circuit 26 that is connected to the signal line 20 via the first directional coupler portion 22 and, in the case of the embodiment illustrated in FIG. 2, via the second directional coupler portion 24. The signal processing circuit 26 comprises a signal analysis circuit 28 and a signal generator circuit 30.

The signal analysis circuit 28 is connected with the common port 18 via the first directional coupler portion 22. In the embodiment shown in FIG. 2, the signal analysis circuit 28 is further connected with the signal generator circuit 30 via the second directional coupler portion 24.

The signal generator circuit 30 comprises a reference signal input 32 that is connected with the reference signal generator 16 via a reference signal line 34, such that the signal generator circuit 30 can receive a reference signal generated by the reference signal generator 16 via the reference signal line 34 and the reference signal input 32.

Optionally, the signal processing circuit 26 may comprise a digital-to-analog converter (DAC) 36 that is configured to convert a signal generated by the signal generator circuit 26 into an analog signal.

Optionally, the signal line 20 may further comprise a signal shaping circuit 38 being interconnected between the signal generator circuit 26 and the common port 18. In general, the signal shaping circuit 38 is configured to alter a signal generated by the signal generator circuit 30 in a predefined manner. For example, the signal shaping circuit 38 may comprises at least one of an amplifier circuit, an attenuator circuit, or a filter circuit. Thus, the signal shaping circuit 38 may be configured to amplify, attenuate, and/or filter the signal generated by the signal generator circuit 30 in a predefined manner.

Figure 3A:
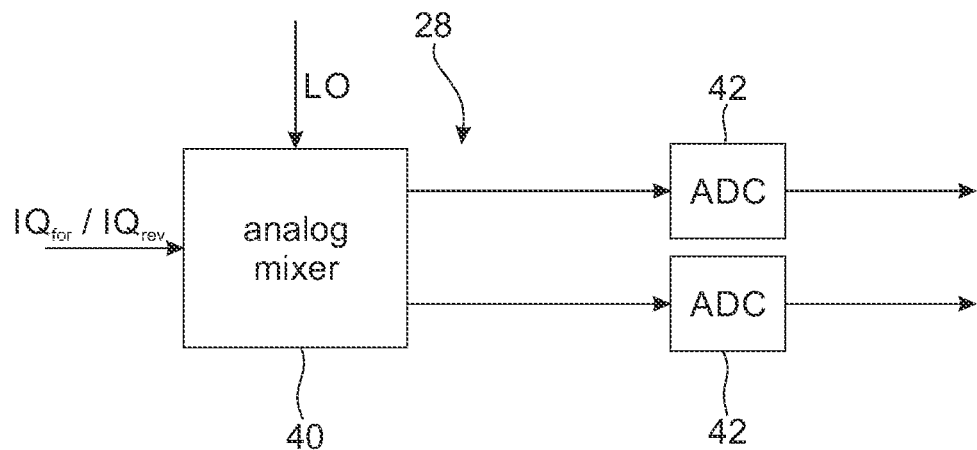
FIG. 3A shows a first embodiment of a portion of a signal analysis circuit.

FIG. 3A shows a first embodiment of a portion of the signal analysis circuit 28 in more detail, wherein the signal analysis circuit 28 is configured to mix a forward-travelling signal IQ_for with a local oscillator signal LO in the analog domain. In the embodiment shown, the signal analysis circuit 28 comprises an analog mixer 40 that is configured to generate an analog I-signal corresponding to the forward-travelling signal IQ_for as well as an analog Q-signal corresponding to the forward-travelling signal IQ_for. The signal analysis circuit 28 may also comprise two analog-to-digital converters (ADC) 42 that are configured to digitize the generated I-signal and the generated Q-signal.

The signal analysis circuit 28 may comprise the components shown in FIG. 3A twice, i.e., one signal path for the forward-travelling signal IQ_for, and one signal path for a backward-travelling signal IQ_rev.

Figure 3B:
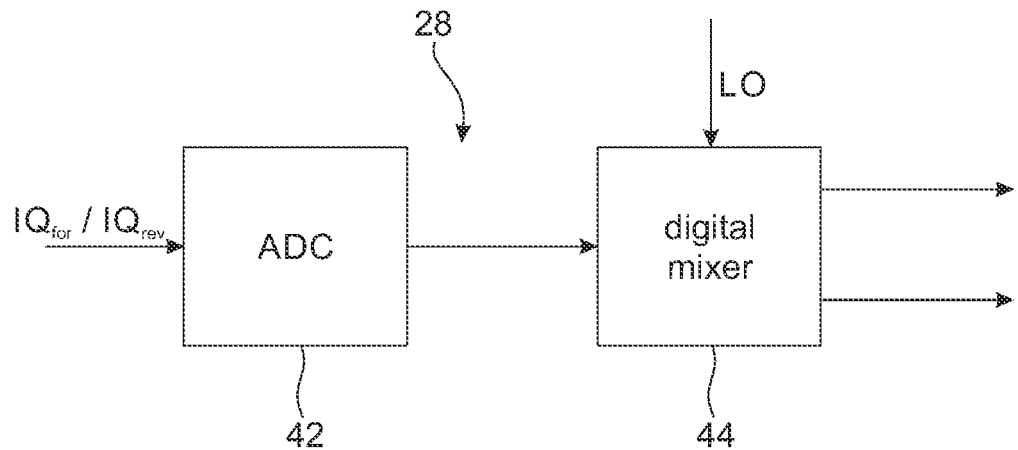
FIG. 3B shows a second embodiment of a portion of a signal analysis circuit.

FIG. 3B shows a second embodiment of a portion of the signal analysis circuit 28, wherein the signal analysis circuit 28 is configured to mix the forward-travelling signal IQ_for with a local oscillator signal LO in the analog domain. In the embodiment shown, the signal analysis circuit 28 comprises a single ADC 42 that is configured to digitize the forward-travelling signal IQ_for. The signal analysis circuit 28 further comprises a digital mixer 44 that is configured to generate a digital I-signal corresponding to the respective digitized signal as well as a digital Q-signal corresponding to the digitized forward-travelling signal IQ_for.

The signal analysis circuit 28 may comprise the components shown in FIG. 3B twice, i.e., one signal path for the forward-travelling signal IQ_for, and one signal path for the backward-travelling signal IQ_rev.

Figure 4:
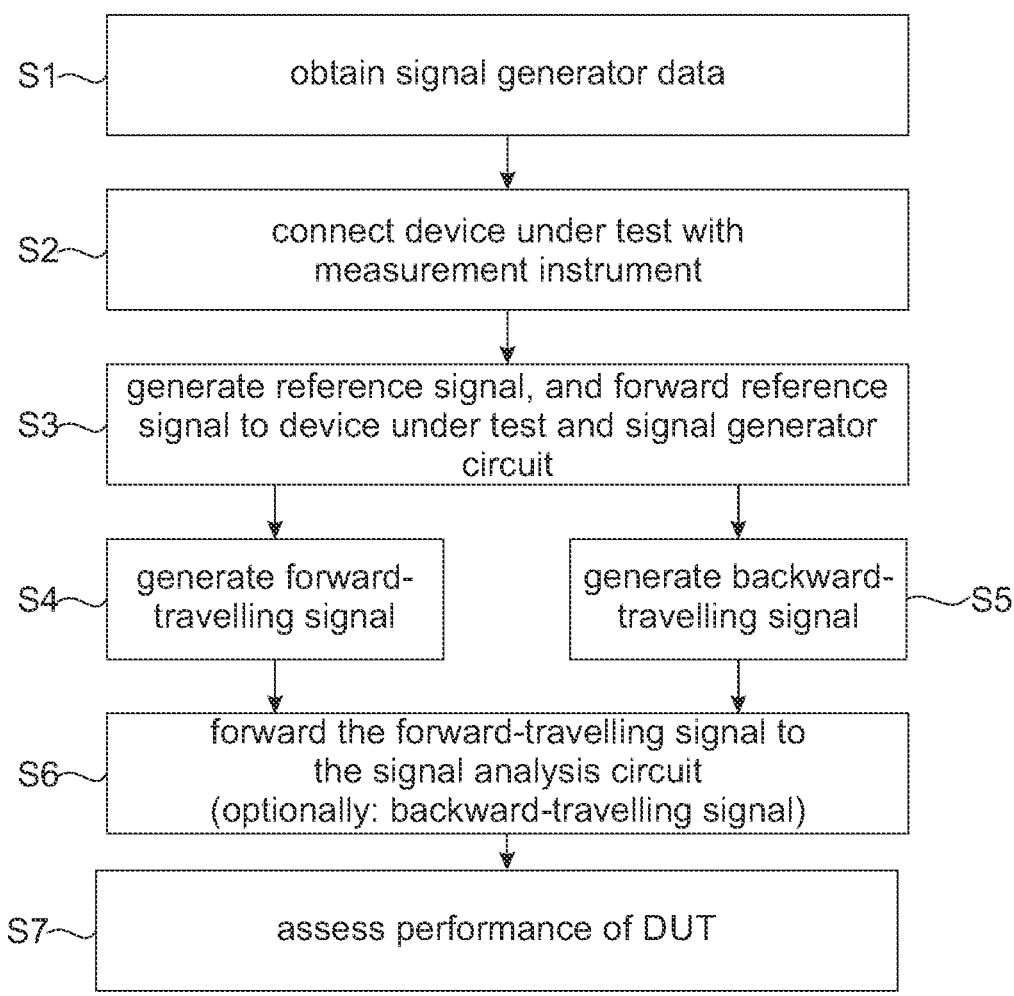
FIG. 4 shows a flow chart of a testing method according to the present disclosure.

The measurement system 10 is configured to perform a testing method of testing the device under test 14, an example of which will be described in the following with reference to FIG. 4.

The first step includes obtaining signal generator data associated with a backward-travelling signal IQ_rev$^{\prime}$ (step S1). For example, the signal generator data may be obtained based on pre-recorded measurement results obtained with a known-good device under test. For example, measurements may be conducted on the known-good device under test by a load pull technique, wherein a backward-travelling signal presented to the known-good device under test is iteratively adapted until a desired impedance for performing a respective test is presented to the known-good device under test. Therein, any suitable load-pull technique known in the state of the art may be used.

Alternatively or additionally, the signal generator data may be obtained based on a mathematical model of the device under test 14. In other words, the backward-travelling signal IQ_rev that is to be presented to the device under test (in order to present the desired impedance to the device under test 14) may be determined based on the mathematical model of the device under test 14, for example based on the mathematical model of the device under test 14 and based on the desired impedance to be presented to the device under test 14.

The signal generator data corresponding to the desired impedance may be saved in the signal generator circuit 26, e.g. in a memory of the signal generator circuit 26. Therein, it is to be understood that the signal generator circuit 26 can reproduce the backward-travelling signal corresponding to the desired impedance based on the signal generator data.

The device under test 14 is connected with the measurement instrument 12 (step S2). For example, in the embodiments shown in FIGS. 1 and 2, a signal output of the device under test 14 is connected with the common port 18, and a signal input of the device under test 14 is connected with the reference signal generator 16.

If the reference signal generator 16 is integrated into the device under test 14 (as is indicated by the dotted lines in FIGS. 1 and 2), the signal output of the device under test 14 is connected with the common port 18. In this case, the device under test 14 may comprise an additional port for forwarding the reference signal to the reference signal input 32, i.e. the additional port may be connected to the reference signal input 32 via the reference signal line 34. Alternatively, the measurement system 10 may comprise a directional coupler, wherein the directional coupler is connected with the device under test 14, more precisely with the signal output of the device under test 14, the common port 18, and the reference signal input 32.

Without restriction of generality, in the following the signal processing method is described with reference to the embodiments shown in FIGS. 1 and 2. It is noted that the device under test 14 may be structurally identical to the known-good device under test described above.

A reference signal is generated by the reference signal generator 16 (step S3). The generated reference signal is forwarded to the device under test 14. Moreover, the generated reference signal is forwarded to the signal generator circuit 30 via the reference signal line 34 and the reference signal input 32.

The reference signal is processed by the device under test 14, thereby generating a forward-travelling signal IQ_for (step S4). The forward-travelling signal IQ_for may be an IQ data signal comprising IQ data, which is assumed hereinafter without restriction of generality. In general, the forward-travelling signal IQ_for may be modulated according to an arbitrary modulation scheme. The forward-travelling signal IQ_for is forwarded to the common port 18. The forward-travelling signal IQ_for may also be called a "b-wave".

Upon receiving the reference signal, the signal generator circuit 30 generates a backward-travelling signal IQ_rev$^{\prime}$ (step S5). In some embodiments, the signal generator circuit 30 generates the backward-travelling signal IQ_rev$^{\prime}$ based on the signal generator data described above. In other words, the backward-travelling signal IQ_rev$^{\prime}$ may be played back by the signal generator circuit 30 based on the signal generator data. The backward-travelling signal IQ_rev$^{\prime}$ may also be called a "b-wave".

The signal generator circuit 30 generates the backward-travelling signal IQ_rev$^{\prime}$ based on the reference signal such that the backward-travelling signal IQ_rev is forwarded to the common port 18 in time with receiving the forward-travelling signal IQ_for of the device under test 14 via the common port 18. In other words, the generation of the backward-travelling signal IQ_rev$^{\prime}$ is synchronized with the generation of the forward-travelling signal IQ_for such that the forward-travelling signal IQ_for and the backward-travelling signal IQ_rev arrive at the common port 18 at the same time.

Therein, the backward-travelling signal IQ_rev corresponds to the backward-travelling signal IQ_rev$^{\prime}$, which has been processed by the signal shaping circuit 38.

In general, the backward-travelling signal IQ_rev is of the same signal type as the forward-travelling signal. Accordingly, the backward-travelling signal is an IQ data signal being modulated according to the same modulation type as the forward-travelling signal IQ_for.

In some embodiments the backward-travelling signal IQ_rev and the forward-travelling signal IQ_for have a predefined amplitude relation and/or a predefined phase relation, such that the backward-travelling signal IQ_rev corresponds to the forward-travelling signal IQ_for, reflected at a predetermined impedance presented to the device under test 14.

In other words, from the viewpoint of the device under test 14 receiving the backward-travelling signal, the backward-travelling signal IQ_rev appears like the forward-travelling signal IQ_for being reflected at an impedance, namely the desired impedance for performing tests on the device under test 14.

In some embodiments, the backward-travelling signal IQ_rev may correspond to at least one of a desired load impedance, a DUT distortion, a DUT modulation, a DUT input power, or a DUT output power. In a further example, the backward-travelling signal IQ_rev may correspond to a sequence of load impedances, DUT distortions, DUT modulations, DUT input powers, and/or DUT output powers. In some embodiments, the sequence of load impedances, DUT distortions, DUT modulations, DUT input powers, and/or DUT output powers may be defined by a test protocol for the device under test 14.

It is emphasized that the backward-travelling signal IQ_rev$^{\prime}$ is generated independent of an analysis of the forward-travelling signal IQ_for. In other words, no feedback loop is provided between the signal analysis circuit 28 and the signal generator circuit 30.

The forward-travelling signal IQ_for is forwarded to the signal analysis circuit 28 via the first directional coupler portion 22 (step S6). Optionally, the backward-travelling signal IQ_rev may be forwarded to the signal analysis circuit via the second directional coupler portion 24.

The forward-travelling signal IQ_for is analyzed by the signal analysis circuit 28 in order to assess a performance of the device under test 14 (step S7). In some embodiments, the analysis circuit 28 may be configured to determine at least one performance parameter based on the forward-travelling signal IQ_for in order to assess the performance of the device under test 14.

Optionally, the analysis circuit 28 may be configured to determine the at least one performance parameter based on the forward-travelling signal IQ_for and based on the backward-travelling signal IQ_rev. For example, the at least one performance parameter may comprise an error vector magnitude (EVM) and/or an adjacent channel leakage ratio (ACLR). However, it is to be understood that the signal analysis circuit 28 may determine any other suitable performance parameter in order to assess the performance of the device under test 14.

In some embodiments, the signal analysis circuit 28 may compare the at least one determined performance parameter, e.g. the EVM and/or the ACLR, with at corresponding measurement result of a known-good device under test. If the at least one determined performance parameter differs from the corresponding measurement result of the known-good device by less than a predefined amount, it may be concluded that the device under test 14 has passed the test. If the at least one determined performance parameter differs from the corresponding measurement result of the known-good device by more than the predefined amount, it may be concluded that the device under test 14 has failed the test.

In a further example, the signal analysis circuit 28 may be configured to determine an impedance presented to the device under test 14 based on the forward-travelling signal IQ_for and based on the backward-travelling signal IQ_rev.

For example, a reflection coefficient K(t) may be determined according to K(t)=IQ_rev(t)VIQ_for(t). Based on the determined reflection coefficient K(t), the impedance Z_load presented to the device under test 14 can be determined according to the following:

$$K(t) = (Z\_load(t) - Z\_0^{\wedge *})/(Z\_load(t) + Z\_0).$$

Therein, Z_0 is the characteristic impedance of the measurement system 10 downstream of the device under test 14. For example, the characteristic impedance Z_0 may be of the magnitude of 50 Ohm.

For example, the signal analysis circuit 28 may compare the impedance presented to the device under test 14 with a desired impedance that is to be presented to the device under test 14 in order to assess whether the correct measurement conditions for testing the device under test 14 are set. Alternatively or additionally, the signal analysis circuit 28 may determine whether the determined impedance meets certain criteria.

For example, the signal analysis circuit 28 may determine whether the determined impedance lies within a predetermined impedance range. If the determined impedance lies within the predetermined range, it may be concluded that the device under test 14 has passed the test. If the determined impedance lies outside of the predetermined range, it may be concluded that the device under test 14 has failed the test.

Figure 5:
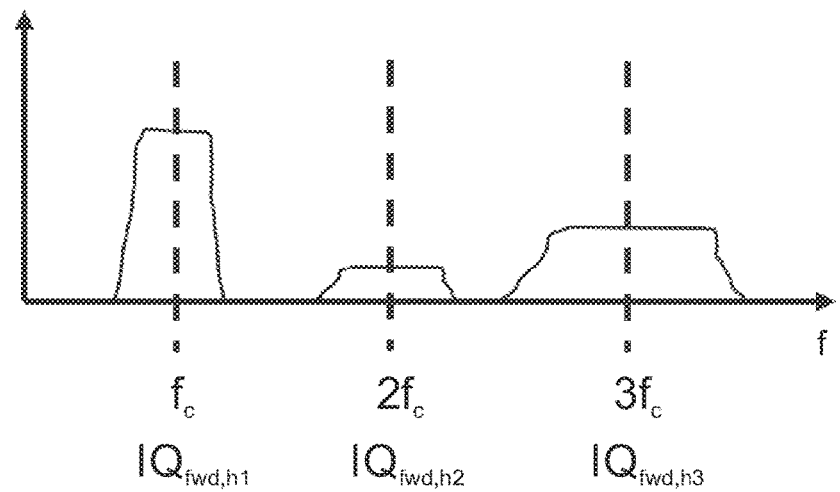
FIG. 5 schematically shows a plot of a forward-travelling signal over frequency.

As is schematically illustrated in FIG. 5, the forward-travelling signal IQ_for usually not only comprises a wanted signal portion IQ_(for, h1) centered around a carrier frequency f_c, but also harmonic distortions IQ_(for, hn) centered around integer multiples of the carrier frequency, i.e. at frequencies n·f_c.

The measurement system 10 of FIG. 1 can be adapted to also take these harmonic distortions into account, as is described in the following with reference to FIG. 6. In the following, only the differences compared to the embodiment shown in FIG. 2 are described.

Figure 6:
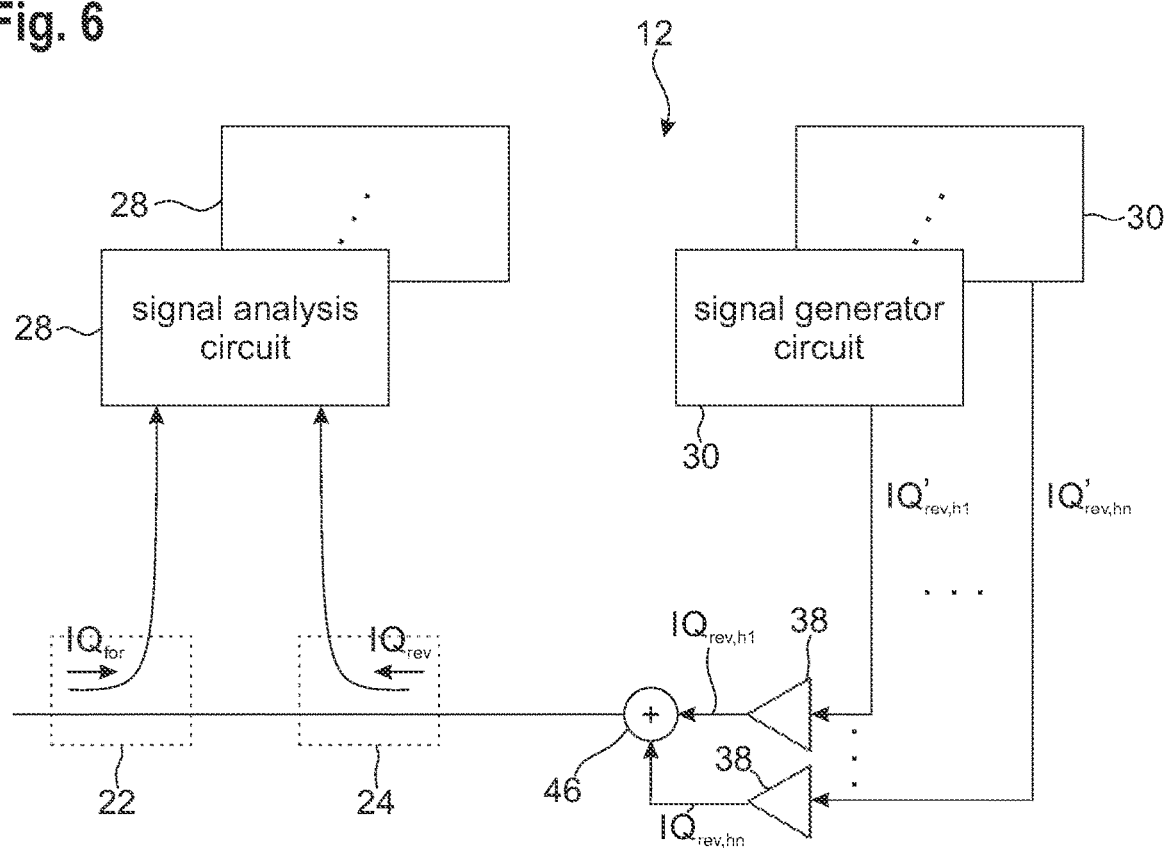
FIG. 6 schematically shows a further embodiment of a portion of the measurement system according to the present disclosure.

It is to be understood that certain components like the DAC 36 may not be shown in FIG. 6, but may of course be present nevertheless. Moreover, it is to be understood that the second directional coupler portion 24 is optional.

As is illustrated in FIG. 6, the measurement instrument 12 may comprise a plurality of copies of the signal processing circuit 26, i.e. of the signal analysis circuit 28 and of the signal generator circuit 30, and of the signal shaping circuit 38 (exemplarily represented by an amplifier in FIG. 6).

A first copy of the signal generator circuit 30 generates a first portion IQ_(rev,h1)^* of the backward-travelling signal IQ_rev^*, as described above. A first copy of the signal analysis circuit 28 analyzes a first portion IQ_(fwd,h1) of the forward-travelling signal IQ_for, as described above.

A second copy of the signal generator circuit 30 generates a first harmonic IQ_(for,h2) of the backward-travelling signal IQ_rev^*, etc. A second copy of the signal analysis circuit 28 analyzes a second portion IQ_(fwd,h2) of the forward-travelling signal IQ_for, namely a first harmonic of the forward-travelling signal, etc.

In some embodiments, an arbitrary number n of such copies may be provided, such that up to (n−1) harmonics of the forward-travelling signal IQ_for and of the backward-travelling signal IQ_rev are considered.

The different portions IQ_(rev, h1) to IQ_(rev, hn) of the backward-travelling signal IQ_rev may be combined by a combiner circuit 46, thereby obtaining the backward-travelling signal IQ_rev. The combiner circuit 46 may, for example, be a filter-based combiner, such as a diplexer or a triplexer. Alternatively, the combiner circuit 46 may be a power combiner or any other suitable type of combiner.

Therein, all copies of the signal analysis circuit 28 may receive the forward-travelling signal IQ_for and, optionally, the backward-travelling signal IQ_rev via the first directional coupler portion 22 and the second directional coupler portion 24, respectively.

In some embodiments, the signal analysis circuit 28 may comprise appropriate filters in order to filter out the respective signal portions to be processed.

In some embodiments, the measurement system 10 may be configured to perform the testing method described above, wherein up to (n−1) harmonics of the forward-travelling signal IQ_for and of the backward-travelling signal IQ_rev are considered.

Alternatively or additionally to considering harmonics of the forward-travelling signal IQ_for and of the backward-travelling signal IQ_rev, the architecture shown in FIG. 6 may also be used in order to process forward-travelling signals IQ_for comprising several different frequency bands, i.e. different frequency bands that are non-harmonically related.

Figure 7:
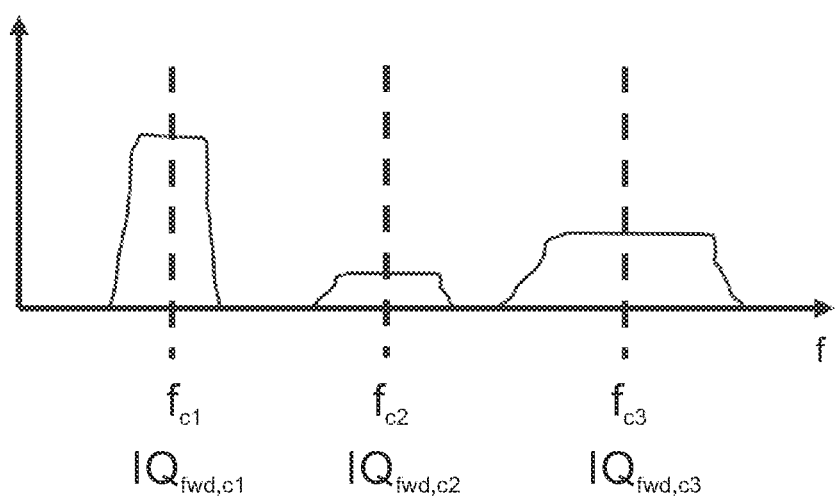
FIG. 7 schematically shows a further plot of a forward-travelling signal over frequency.

As is illustrated in FIG. 7, the forward-travelling signal IQ_for may comprise a first signal portion IQ_(for, c1)

centered around a first carrier frequency f_c1, a second signal portion IQ_(for, c2) centered around a second carrier frequency f_c2, etc.

In some embodiments, the forward-travelling signal IQ_for may comprise up to n different signal portions associated with up to n different carrier frequencies, wherein the different carrier frequencies may have arbitrary relations to each other.

Analogously to as described above with respect to the harmonics, a first one of the copies of the signal processing circuit 26 may process the first signal portion IQ_(for, c1) of the forward-travelling signal IQ_for, and a corresponding first portion IQ_(rev, c1)$^{\wedge\prime}$ of the backward-travelling signal IQ_rev$^{\wedge\prime}$. A second one of the copies of the signal processing circuit 26 may process the second signal portion IQ_(for, c2) of the forward-travelling signal IQ_for, and a corresponding second portion IQ_(rev, c2)$^{\wedge\prime}$ of the backward-travelling signal IQ_rev$^{\wedge\prime}$, etc.

In some embodiments, the measurement system 10 may be configured to perform the testing method described above, wherein up to n different portions of the forward-travelling signal IQ_for and of the backward-travelling signal IQ_rev having different frequencies are considered.

Therein, the individual portions IQ_(rev,cn)$^{\wedge\prime}$ of the backward-travelling signal IQ_rev$^{\wedge\prime}$ may be generated such that the same predefined impedance is applied to the device under test 14 in all frequency bands associated with the different portions IQ_(for, cn) of the forward-travelling signal IQ_for.

However, it is also conceivable that the individual portions IQ_(rev,cn)$^{\wedge\prime}$ of the backward-travelling signal IQ_rev$^{\wedge\prime}$ may be generated such that different predefined impedances are applied to the device under test 14 in different frequency bands associated with the different portions IQ_(for,cn) of the forward-travelling signal IQ_for.

Certain embodiments disclosed herein include systems, apparatus, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality or methodology described herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure, or components thereof, may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure, or components thereof, may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In some embodiments, the signal processing circuit 26, the signal analysis circuit 28, the signal generator circuit 30, the signal shaping circuit 38, etc., or components thereof, are configured to perform one or more method steps of the claimed subject matter. In some embodiments, one or more of these components includes one or more computer-readable media containing computer readable instructions embodied thereon that, when executed by one or more computer circuits, sometimes referred to as computing devices, cause the one or more computer circuits to perform one or more method steps of the claimed subject matter. In some embodiments, the one or more computer circuits includes a microprocessor, a microcontroller, a central processing unit, a graphics processing unit (GPU), a digital signal processor (DSP), an ASIC, etc.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B." Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement instrument for testing a device under test, the measurement instrument comprising:
    a common port configured to be connectable to a signal output of the device under test, wherein the common port is configured to receive a forward-travelling signal from the device under test;
    a signal line connected to the common port; and
    a signal processing circuit, wherein the signal processing circuit comprises a signal analysis circuit and a signal generator circuit,
    wherein the signal analysis circuit is connected with the common port so as to receive the forward-travelling signal from the common port,
    wherein the signal analysis circuit is configured to analyze the forward-travelling signal in order to assess a performance of the device under test,
    wherein the signal generator circuit is connected to the signal line, wherein the signal generator circuit is configured to generate a backward-travelling signal that is forwarded to the common port,
    wherein the signal generator circuit comprises a reference signal input, the reference signal input being configured to receive a reference signal from a reference signal generator, and
    wherein the signal generator circuit is configured to generate the backward-travelling signal based on the reference signal.

2. The measurement instrument of claim 1, wherein the signal generator circuit is configured to generate the backward-travelling signal based on the reference signal such that the backward-travelling signal is forwarded to the common port in time with receiving an output signal of the device under test via the common port.

3. The measurement instrument of claim 1, wherein the signal line comprises a first directional coupler portion, wherein the signal analysis circuit is connected with the common port via the first directional coupler portion.

4. The measurement instrument of claim 1, further comprising a signal shaping circuit, wherein the signal shaping circuit is interconnected between the signal generator circuit and the common port.

5. The measurement instrument of claim 4, wherein the signal shaping circuit comprises at least one of an amplifier circuit, an attenuator circuit, or a filter circuit.

6. The measurement instrument of claim 1, wherein the signal generator circuit is configured to generate the backward-travelling signal such that the forward-travelling signal and the backward-travelling signal have a predefined amplitude relation and/or a predefined phase relation.

7. The measurement instrument of claim 1, wherein the signal generator circuit is configured to generate the backward-travelling signal such that the forward-travelling signal and the backward-travelling signal have the same modulation type.

8. The measurement instrument of claim 1, wherein the reference signal corresponds to an input signal of the device under test or to a signal generated by the device under test.

9. The measurement instrument of claim 1, wherein the signal line comprises a second directional coupler portion, wherein the signal analysis circuit is connected with the signal generator circuit via the second directional coupler portion so as to receive the backward-travelling signal.

10. The measurement instrument of claim 9, wherein the signal analysis circuit is configured to determine an impedance presented to the device under test based on the forward-travelling signal and based on the backward-travelling signal.

11. The measurement instrument of claim 9, wherein the signal analysis circuit is configured to assess the performance of the device under test based on the forward-travelling signal and based on the backward-travelling signal.

12. The measurement instrument of claim 1, wherein the measurement instrument is configured to operate the signal generator circuit independent of the signal analysis circuit.

13. The measurement instrument of claim 1, wherein the backward-travelling signal corresponds to at least one of a desired load impedance, a DUT distortion, a DUT modulation, a DUT input power, or a DUT output power.

14. The measurement instrument of claim 1, wherein the backward-travelling signal is generated based on pre-recorded measurement results obtained with a known-good device under test.

15. The measurement instrument of claim 1, wherein the backward-travelling signal is generated based on a mathematical model of the device under test.

16. The measurement instrument of claim 1, wherein the measurement instrument is established as a signal analyzer, a vector signal analyzer, an oscilloscope, a digital oscilloscope, or a vector network analyzer.

17. The measurement instrument of claim 1, wherein the signal analysis circuit is configured to determine at least one of a error vector magnitude (EVM) or an adjacent channel leakage ratio (ACLR) based on the forward-travelling signal.

18. A measurement system, the measurement system comprising a measurement instrument according to claim 1 and a device under test.

19. The measurement system of claim 18, wherein the reference signal generator is established separately from the device under test and from the measurement instrument.

20. The measurement system of claim 18, wherein the reference signal generator is integrated into the device under test.

21. A testing method of testing a device under test by a measurement instrument, the measurement instrument comprising a common port and a signal processing circuit, wherein the common port is connectable to a signal output of the device under test, wherein the signal processing circuit comprises a signal analysis circuit and a signal generator circuit, and wherein the signal generator circuit comprises a reference signal input, the testing method comprising the steps of:
  receiving, by the common port, a forward-travelling signal from the device under test;
  receiving, by the reference signal input, a reference signal from a reference signal generator;
  generating, by the signal generator circuit, a backward-travelling signal based on the reference signal;
  forwarding the backward-travelling signal to the common port; and
  analyzing, by the signal analysis circuit, the forward-travelling signal in order to assess a performance of the device under test.

* * * * *